United States Patent
Sugimoto

(10) Patent No.: US 12,439,671 B2
(45) Date of Patent: Oct. 7, 2025

(54) SEMICONDUCTOR DEVICE

(71) Applicant: KABUSHIKI KAISHA TOSHIBA, Tokyo (JP)

(72) Inventor: Yuta Sugimoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 18/007,227

(22) PCT Filed: Jul. 26, 2021

(86) PCT No.: PCT/JP2021/027568
§ 371 (c)(1),
(2) Date: Jan. 27, 2023

(87) PCT Pub. No.: WO2022/025000
PCT Pub. Date: Feb. 3, 2022

(65) Prior Publication Data
US 2023/0307516 A1    Sep. 28, 2023

(30) Foreign Application Priority Data

Jul. 30, 2020   (JP) ................................ 2020-129238

(51) Int. Cl.
*H10D 64/23*    (2025.01)
*H01L 23/48*    (2006.01)
(Continued)

(52) U.S. Cl.
CPC ......... *H10D 64/254* (2025.01); *H01L 23/481* (2013.01); *H10D 1/694* (2025.01);
(Continued)

(58) Field of Classification Search
CPC .... H10D 1/694; H10D 30/015; H10D 64/254; H10D 30/475; H10D 64/01;
(Continued)

(56) References Cited

U.S. PATENT DOCUMENTS

| 8,779,470 B2 | 7/2014 | Yamamura |
| 2011/0057232 A1 | 3/2011 | Sheppard et al. |

(Continued)

FOREIGN PATENT DOCUMENTS

| JP | 2010-163938 A | 7/2010 |
| JP | 2012-28442 A | 2/2012 |

(Continued)

OTHER PUBLICATIONS

European Patent Office, Extended European Search Report in EP App. No. 21850141.9, 10 pages (Sep. 23, 2024).

(Continued)

*Primary Examiner* — Victor A Mandala
(74) *Attorney, Agent, or Firm* — Finnegan, Henderson, Farabow, Garrett & Dunner, LLP

(57) ABSTRACT

A semiconductor device includes a semiconductor substrate, a first semiconductor layer on the semiconductor substrate, a second semiconductor layer on the first semiconductor layer, a first electrode on the second semiconductor layer, a second electrode arranged with the first electrode along a front surface of the second semiconductor layer, a third electrode between the first and second electrodes on the second semiconductor layer, a metal layer on a back surface of the semiconductor substrate at a side opposite to the first semiconductor layer, and a conductor extending inside the semiconductor substrate and electrically connecting the first electrode and the metal layer via the second semiconductor layer. The second semiconductor layer includes a first region including a first-conductivity-type impurity, and a second region including a first-conductivity-type impurity with a higher concentration than the first region; and the second region is between the conductor and the first electrode.

9 Claims, 8 Drawing Sheets

(51) Int. Cl.
*H10D 1/68* (2025.01)
*H10D 30/01* (2025.01)
*H10D 30/47* (2025.01)
*H10D 64/01* (2025.01)
*H10D 62/85* (2025.01)
*H10D 62/854* (2025.01)

(52) U.S. Cl.
CPC ......... *H10D 30/015* (2025.01); *H10D 30/475* (2025.01); *H10D 64/01* (2025.01); *H10D 64/257* (2025.01); *H10D 62/8503* (2025.01); *H10D 62/854* (2025.01)

(58) Field of Classification Search
CPC ............. H10D 64/257; H10D 62/8503; H10D 62/854; H10D 1/68; H10D 62/149; H10D 62/151; H01L 21/3205; H01L 23/481; H01L 21/768; H01L 23/4824; H01L 23/522
See application file for complete search history.

(56) References Cited

U.S. PATENT DOCUMENTS

| | | | |
|---|---|---|---|
| 2012/0021598 A1 | 1/2012 | Kawakubo | |
| 2013/0075750 A1 | 3/2013 | Minoura | |
| 2013/0228790 A1* | 9/2013 | Yamamura | H10D 64/257 257/195 |
| 2014/0291860 A1* | 10/2014 | Stuber | H10D 86/01 257/774 |
| 2015/0145032 A1 | 5/2015 | Quay et al. | |
| 2016/0315159 A1* | 10/2016 | Yang | H10D 64/254 |
| 2016/0343801 A1* | 11/2016 | Pilla | H10D 30/66 |
| 2017/0069623 A1 | 3/2017 | Saito et al. | |
| 2019/0097592 A1* | 3/2019 | Goktepeli | H04B 1/525 |
| 2019/0296112 A1* | 9/2019 | Yoshimochi | H10D 64/251 |
| 2022/0231157 A1* | 7/2022 | Wu | H10D 64/411 |

FOREIGN PATENT DOCUMENTS

| | | |
|---|---|---|
| JP | 2013-98274 A | 5/2013 |
| JP | 2013-183060 A | 9/2013 |
| JP | 2017-50511 A | 3/2017 |

OTHER PUBLICATIONS

Japan Patent Office, Int'l Preliminary Report on Patentability for PCT/JP2021/027568, 5 pages (Oct. 19, 2021).
European Patent Office, Office Action in EP App. No. 21850141.9 (Jul. 9, 2025).

* cited by examiner

SEMICONDUCTOR DEVICE

CROSS-REFERENCE TO RELATED APPLICATIONS

This Application is the National Stage of International Application No. PCT/JP2021/027568, filed Jul. 26, 2021, and published on Feb. 3, 2021, as WO 2022/025000 A1, the contents of which are incorporated herein by reference in their entireties.

TECHNICAL FIELD

An embodiment relates to a semiconductor device.

BACKGROUND ART

In a semiconductor device in which a semiconductor element such as a transistor or the like is provided at the front side of a semiconductor substrate, there are cases where the semiconductor element and an electrode on the back surface of the semiconductor substrate are electrically connected by forming a via hole from the backside to the semiconductor element.

PRIOR ART DOCUMENTS

Patent Literature

[Patent Document 1]
JP 2012-28442 A

Non-Patent Literature

[Non-Patent Document 1]
IEICE Technical Report, ED, Electron Devices 95, p. 71-74

SUMMARY OF INVENTION

Technical Problem

An embodiment provides a semiconductor device in which the manufacturing efficiency can be increased.

Solution to Problem

A semiconductor device according to an embodiment includes a semiconductor substrate, a first semiconductor layer provided on the semiconductor substrate, a second semiconductor layer provided on the first semiconductor layer, a first electrode provided on the second semiconductor layer, a second electrode provided to be arranged with the first electrode along a front surface of the second semiconductor layer, a third electrode provided between the first electrode and the second electrode on the second semiconductor layer, a metal layer provided on a back surface of the semiconductor substrate at a side opposite to the first semiconductor layer, and a conductor that extends inside the semiconductor substrate and electrically connects the first electrode and the metal layer via the second semiconductor layer. The second semiconductor layer includes a first region including a first-conductivity-type impurity, and a second region including a first-conductivity-type impurity with a higher concentration than the first-conductivity-type impurity of the first region; and the second region of the second semiconductor layer is provided between the conductor and the first electrode.

DESCRIPTION OF EMBODIMENTS

Figure 1:
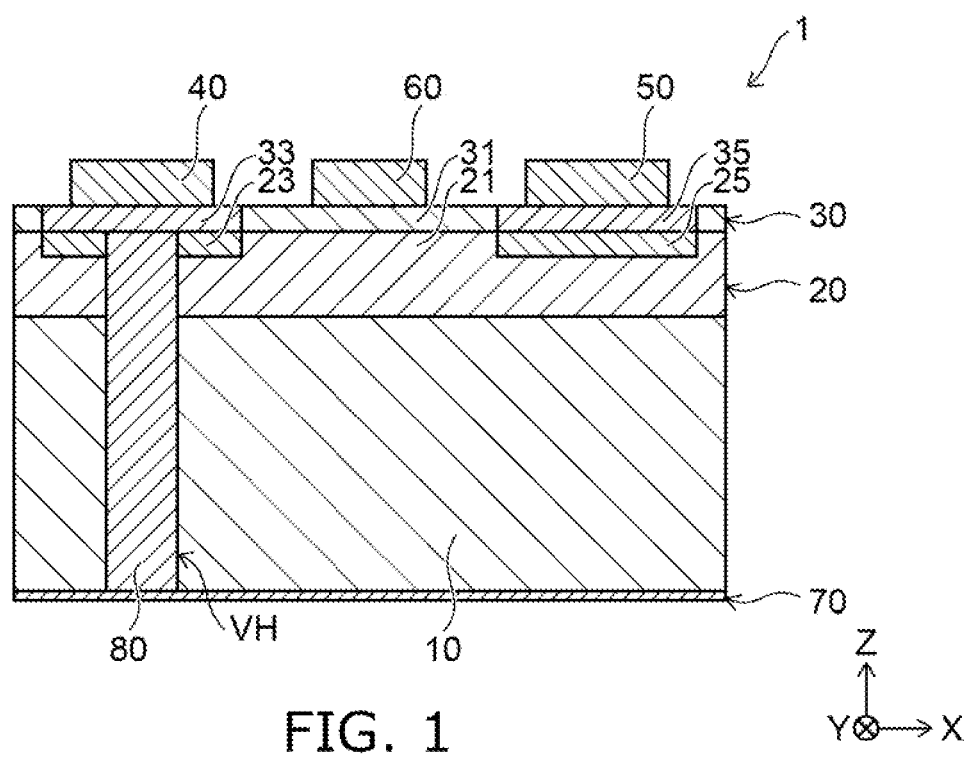
FIG. 1 is a schematic cross-sectional view showing a semiconductor device according to an embodiment.

Embodiments will now be described with reference to the drawings. The same portions in the drawings are marked with the same numerals; a detailed description is omitted as appropriate; and different portions are described. The drawings are schematic or conceptual; and the relationships between the thickness and width of portions, the proportions of sizes among portions, etc., are not necessarily the same as the actual values. Also, the dimensions and proportions may be illustrated differently among drawings, even when the same portion is illustrated.

Furthermore, the arrangements and configurations of the portions are described using an X-axis, a Y-axis, and a Z-axis shown in the drawings. The X-axis, the Y-axis, and the Z-axis are orthogonal to each other and respectively represent an X-direction, a Y-direction, and a Z-direction. Also, there are cases where the Z-direction is described as up, and the opposite direction is described as down.

FIG. 1 is a schematic cross-sectional view showing a semiconductor device 1 according to an embodiment. The semiconductor device 1 is, for example, a field-effect transistor (FET). The semiconductor device 1 includes a semiconductor substrate 10, a first semiconductor layer 20, a second semiconductor layer 30, a first electrode 40, a second electrode 50, and a third electrode 60.

The first semiconductor layer 20 is provided on the semiconductor substrate 10. The second semiconductor layer 30 is provided on the first semiconductor layer 20. The semiconductor substrate 10 is, for example, a high-resistance substrate or a semi-insulating substrate. The semiconductor substrate 10 is, for example, a silicon carbide (SiC) substrate. The first semiconductor layer 20 is, for example, an n-type gallium nitride (GaN) layer. For example, the bandgap of the second semiconductor layer 30 is wider than the bandgap of the first semiconductor layer 20. The second semiconductor layer 30 includes, for example, a mixed crystal of the compositional formula $Al_{1-x}Ga_xN$ (hereinbelow, AlGaN). The first semiconductor layer 20 and the second semiconductor layer 30 each include a first-conductivity-type impurity (hereinbelow, an n-type impurity).

The first semiconductor layer 20 includes a first region 21, a second region 23, and a third region 25. The second region 23 and the third region 25 each include, for example, an n-type impurity with a higher concentration than the n-type impurity of the first region 21. For example, the first region 21 is provided between the second region 23 and the third region 25.

The second semiconductor layer 30 includes a first region 31, a second region 33, and a third region 35. For example, the second region 33 and the third region 35 each include an n-type impurity with a higher concentration than the n-type impurity of the first region 31. For example, the first region 31 is provided between the second region 33 and the third region 35.

The second region 33 of the second semiconductor layer 30 is provided between the first electrode 40 and the second region 23 of the first semiconductor layer 20. The third region 35 of the second semiconductor layer 30 is provided between the second electrode 50 and the third region 25 of the first semiconductor layer 20. For example, the first region 31 of the second semiconductor layer 30 is provided between the third electrode 60 and the first region 21 of the first semiconductor layer 20.

The first semiconductor layer 20 includes, for example, a portion extending between the semiconductor substrate 10 and the second region 23. Also, the first semiconductor layer 20 includes, for example, a portion extending between the semiconductor substrate 10 and the third region 25.

The first electrode 40, the second electrode 50, and the third electrode 60 are provided on the second semiconductor layer 30. The first electrode 40, the second electrode 50, and the third electrode 60 are arranged along the front surface of the second semiconductor layer 30. The third electrode 60 is provided between the first electrode 40 and the second electrode 50.

The first electrode 40 is, for example, a source electrode. The first electrode 40 is electrically connected to the second region 33 of the second semiconductor layer 30. For example, the first electrode 40 has an ohmic contact with the second region 33 of the second semiconductor layer 30.

The second electrode 50 is, for example, a drain electrode. The second electrode 50 is electrically connected to the third region 35 of the second semiconductor layer 30. For example, the second electrode 50 has an ohmic contact with the third region 35 of the second semiconductor layer 30.

The third electrode 60 is, for example, a gate electrode. For example, the third electrode 60 has a Schottky contact with the first region 31 of the second semiconductor layer 30.

The semiconductor device 1 further includes a metal layer 70 and a connection conductor 80. For example, the metal layer 70 is provided on the back surface of the semiconductor substrate 10 at the side opposite to the first semiconductor layer 20. In other words, the semiconductor substrate 10 is positioned between the first semiconductor layer 20 and the metal layer 70.

The connection conductor 80 is provided inside the semiconductor substrate 10 and the first semiconductor layer 20. For example, the connection conductor 80 extends in the direction (e.g., the Z-direction) from the metal layer 70 toward the first electrode 40. The connection conductor 80 electrically connects the metal layer 70 and the first electrode 40. For example, the connection conductor 80 is electrically connected to the first electrode 40 via the second region 33 of the second semiconductor layer 30. For example, the connection conductor 80 is provided to contact the second region 33.

A method for manufacturing the semiconductor device 1 will now be described with reference to FIGS. 2A to 3C.

FIGS. 2A to 3C are schematic cross-sectional views showing manufacturing processes of the semiconductor device 1 according to the embodiment.

Figure 2A:
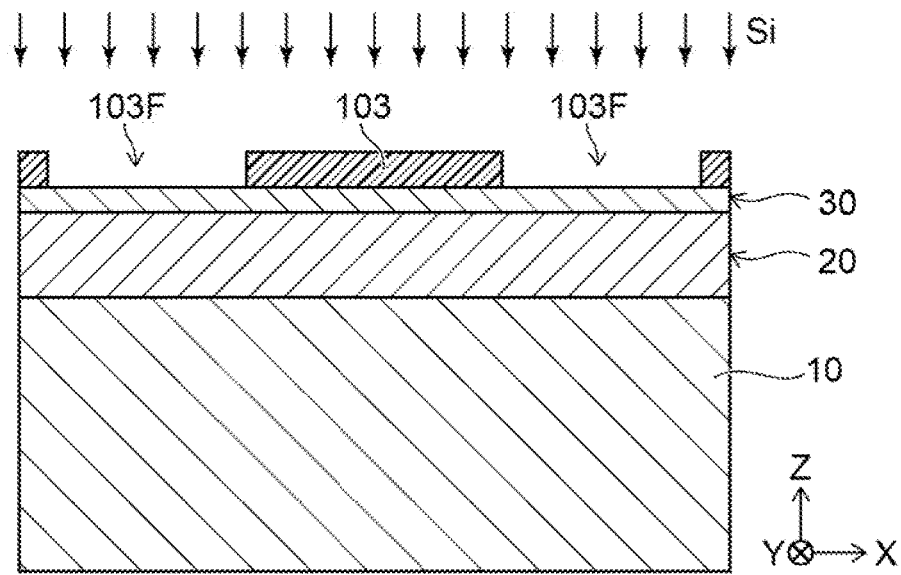
FIG. 2 are schematic cross-sectional views showing manufacturing processes of the semiconductor device according to the embodiment.

As shown in FIG. 2A, a wafer is prepared in which the first semiconductor layer 20 and the second semiconductor layer 30 are stacked on the semiconductor substrate 10; and a first-conductivity-type impurity, e.g., silicon, is ion-implanted into the front side of the second semiconductor layer 30.

The semiconductor substrate 10 is, for example, a SiC substrate. The semiconductor substrate 10 is, for example, a high-resistance substrate or a semi-insulating substrate. For example, the first semiconductor layer 20 and the second semiconductor layer 30 are epitaxially grown on the semiconductor substrate 10 by using MOCVD (Metal Organic Chemical Vapor Deposition). The first semiconductor layer 20 is, for example, an n-type GaN layer. The first semiconductor layer 20 is, for example, an undoped layer that is not intentionally doped with an impurity. The second semiconductor layer 30 is, for example, an n-type AlGaN layer. For example, the second semiconductor layer 30 is doped with silicon, which is an n-type impurity, in the epitaxial growth. For example, the first semiconductor layer 20 has a higher resistance than the second semiconductor layer 30.

For example, the first-conductivity-type impurity that is ion-implanted into the front side of the second semiconductor layer 30 is selectively implanted using an ion implantation mask 103 having an opening 103F. For example, the ion implantation conditions of the silicon are appropriately set with a dose in the range of $1\times10^{15}$ to $1\times10^{16}$ $cm^{-2}$ and an implantation energy in the range of 30 to 100 keV. For example, the first-conductivity-type impurity is implanted to have a distribution straddling from the second semiconductor layer 30 into a portion of the first semiconductor layer 20.

Figure 2B:
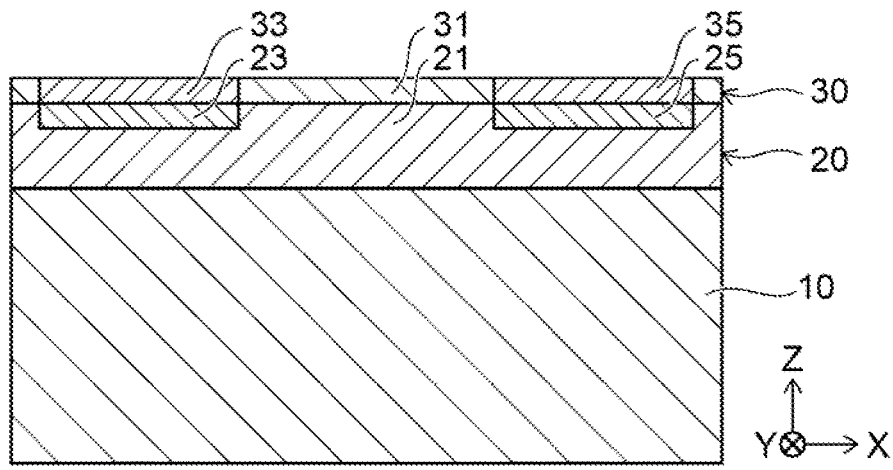

As shown in FIG. 2B, the first region 21, the second region 23, and the third region 25 are formed in the first semiconductor layer 20 by activating the ion-implanted first-conductivity-type impurity. Also, the first region 31, the second region 33, and the third region 35 are formed in the second semiconductor layer 30. After the ion implantation mask 103 is removed, the first-conductivity-type impurity is activated by, for example, heat treatment.

For example, the first region 21 of the first semiconductor layer 20 is provided between the second region 23 and the third region 25. The first-conductivity-type impurity is not ion-implanted into the first region 21. The second region 23 and the third region 25 include first-conductivity-type impurities with higher concentrations than the first-conductivity-type impurity of the first region 21.

The first region 31 of the second semiconductor layer 30 is provided between the second region 33 and the third region 35. The first-conductivity-type impurity is not ion-implanted into the first region 31. The second region 33 and the third region 35 include first-conductivity-type impurities with higher concentrations than the first-conductivity-type impurity of the first region 31.

Figure 2C:
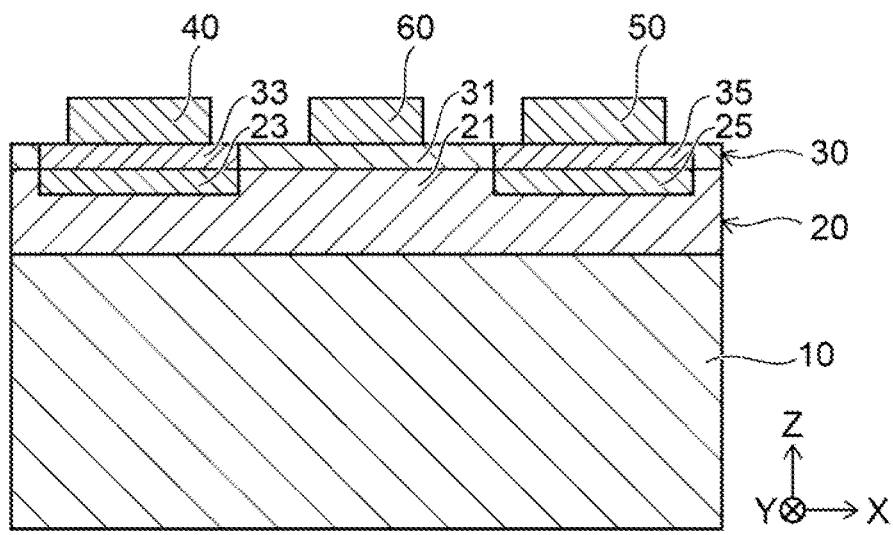

As shown in FIG. 2C, the first electrode 40 is formed on the second region 33 of the second semiconductor layer 30; and the second electrode 50 is formed on the third region 35. Furthermore, the third electrode 60 is formed on the first region 31 of the second semiconductor layer 30.

For example, the first electrode 40, the second electrode 50, and the third electrode 60 are formed using sputtering. For example, the first electrode 40, the second electrode 50, and the third electrode 60 are selectively formed using lift-off. The first electrode 40 and the second electrode 50 are, for example, metal layers that include gold and chrome. The third electrode 60 is, for example, a metal layer that includes titanium and gold.

Figure 3A:
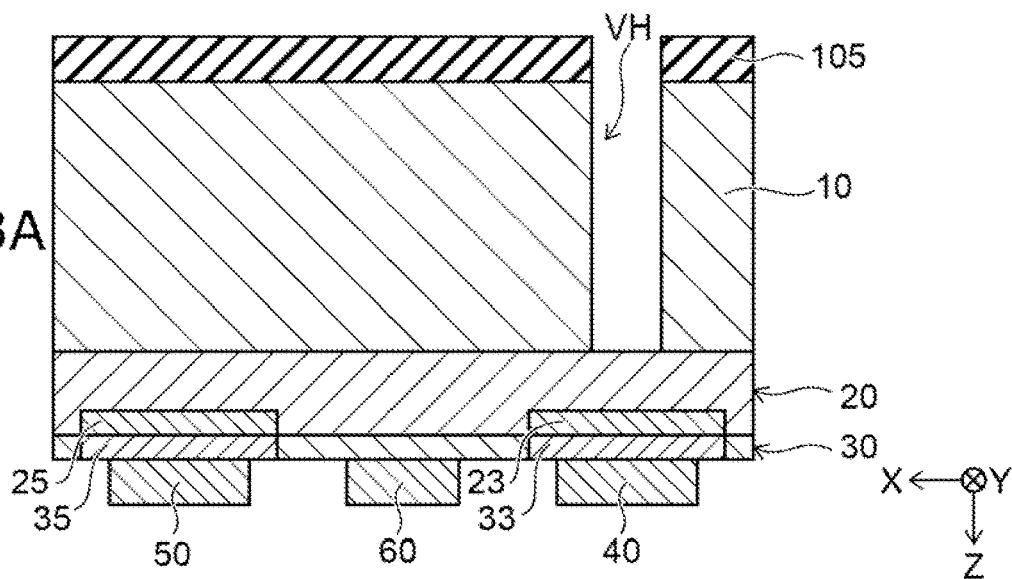
FIG. 3 are schematic cross-sectional views showing manufacturing processes continuing from FIG. 2.

As shown in FIG. 3A, a via hole VH is formed in the backside of the semiconductor substrate 10. For example, the semiconductor substrate 10 is thinned to a prescribed thickness by polishing the backside. Subsequently, for example, the via hole VH is formed by selectively removing the semiconductor substrate 10 by using an etching mask 105. The etching mask 105 is, for example, a silicon oxide film.

For example, the via hole VH is formed using inductively coupled plasma dry etching. When the semiconductor substrate 10 is a SiC substrate, the semiconductor substrate 10 is etched using an etching gas including fluorine. The via hole VH is formed to a depth that extends through the semiconductor substrate 10 and reaches the first semiconductor layer 20.

Figure 3B:
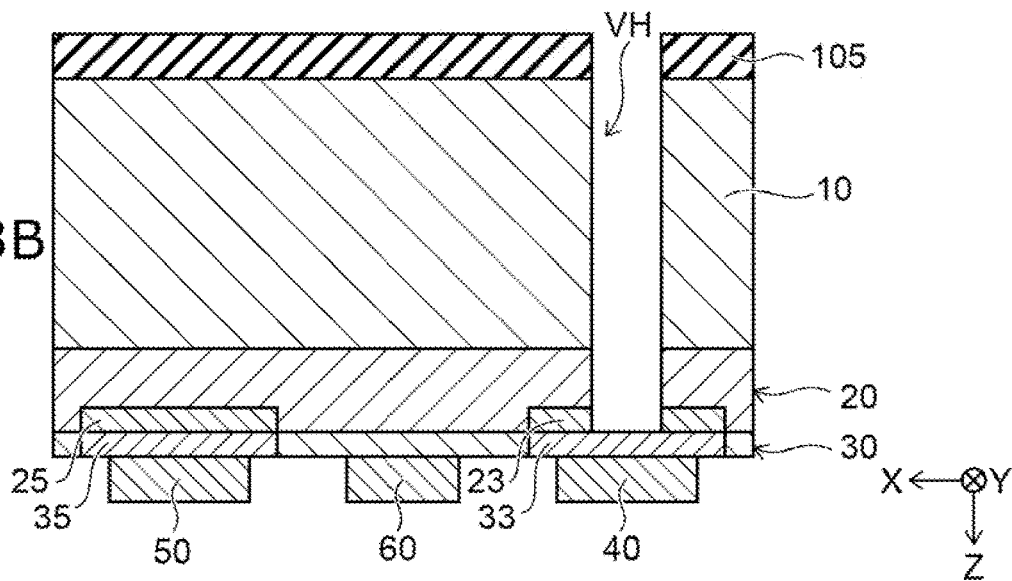

As shown in FIG. 3B, the via hole VH is formed to be deeper by selectively removing the first semiconductor layer 20. When the first semiconductor layer 20 is a GaN layer, for example, the etching is continued using an etching gas including chlorine (Cl). For example, the etching of the semiconductor substrate is stopped and the etching gas is switched at the timing at which the endpoint detector of the dry etching detects gallium (Ga).

For example, the via hole VH is formed to have a depth that reaches the second semiconductor layer 30. When the second semiconductor layer 30 is an AlGaN layer, for example, the etching is stopped at the timing at which aluminum (Al) is detected by the endpoint detector.

Figure 3C:
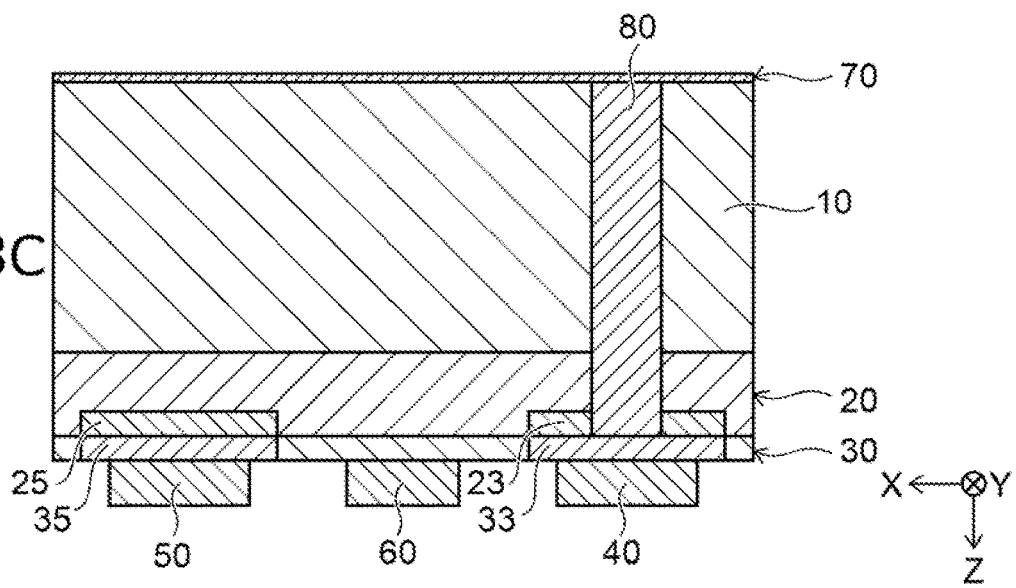

As shown in FIG. 3C, the connection conductor 80 is formed inside the via hole VH, after which the metal layer 70 is formed on the back surface of the semiconductor substrate 10. For example, the connection conductor 80 is formed using plating. The connection conductor 80 is, for example, a columnar metal that includes gold. For example, the metal layer 70 is formed using sputtering. The metal layer 70 includes, for example, nickel and gold.

The connection conductor 80 is formed to contact the second region 33 of the second semiconductor layer 30 and to be electrically connected to the second region 33. The second region 33 is positioned between the first electrode 40 and the connection conductor 80.

According to the embodiment, the process of forming the via hole VH avoids the exposure of the first electrode 40 at the bottom surface of the via hole VH. Thereby, the first electrode 40 can be prevented from being etched, and the adhesion of residue inside the etching apparatus can be prevented. As a result, the cleaning frequency of the etching apparatus can be reduced, and the manufacturing efficiency can be increased.

Figure 4:
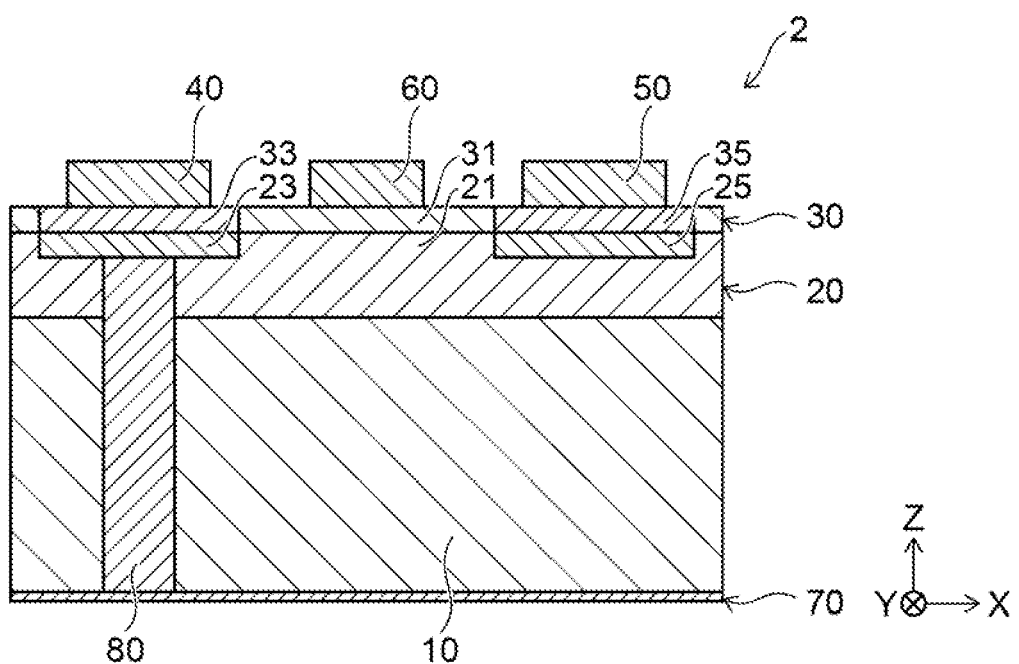
FIG. 4 is a schematic cross-sectional view showing a semiconductor device according to a modification of the embodiment.

FIG. 4 is a schematic cross-sectional view showing a semiconductor device 2 according to a modification of the embodiment. In the semiconductor device 2, the connection conductor 80 contacts the second region 23 of the first semiconductor layer 20 and is electrically connected to the second region 23. The second region 23 of the first semiconductor layer 20 and the second region 33 of the second semiconductor layer 30 are provided between the first electrode 40 and the connection conductor 80. The connection conductor 80 is electrically connected to the first electrode 40 via the second region 23 of the first semiconductor layer 20 and the second region 33 of the second semiconductor layer 30.

Figure 5A:
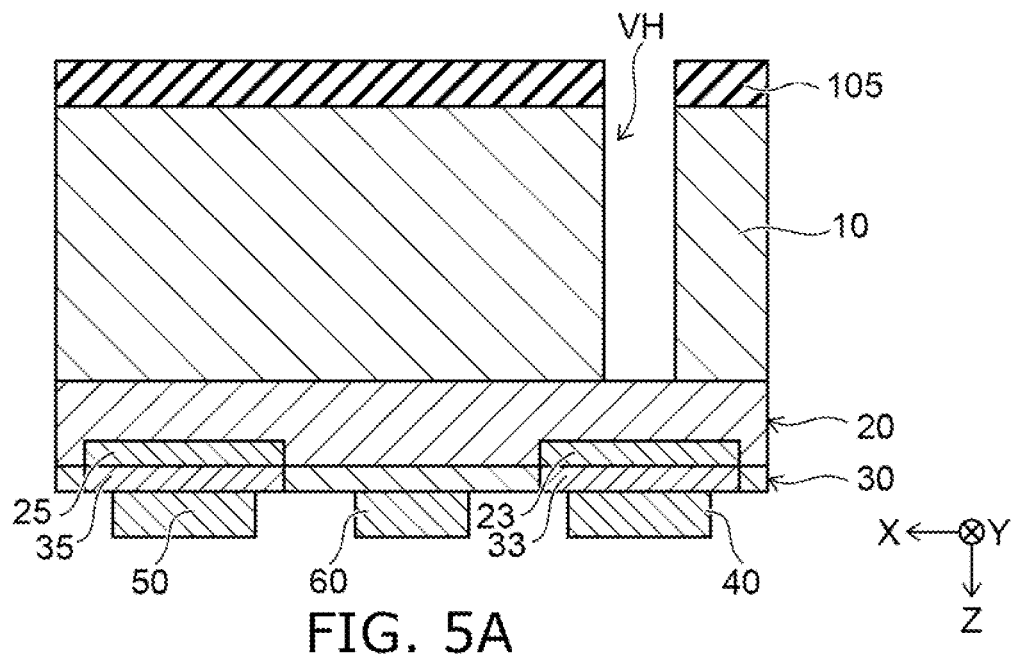
FIG. 5 are schematic cross-sectional views showing manufacturing processes of the semiconductor device according to the modification of the embodiment.
Figure 5B:
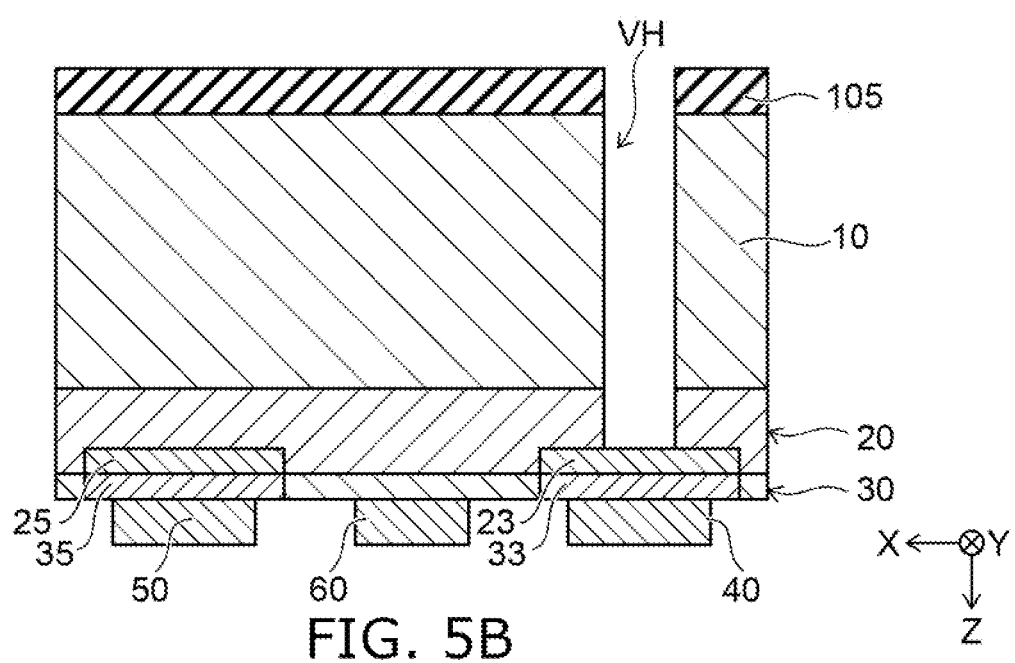

FIGS. 5A and 5B are schematic cross-sectional views showing manufacturing processes of the semiconductor device 2. FIG. 5A illustrates a process corresponding to FIG. 3A.

As shown in FIG. 5A, the first semiconductor layer 20 is selectively removed after forming the via hole VH to a depth that extends through the semiconductor substrate 10 and reaches the first semiconductor layer 20.

As shown in FIG. 5B, the via hole VH is formed to a depth that reaches the second region 23 of the first semiconductor layer 20. For example, dry etching of the first semiconductor layer 20 is performed using an etching gas including chlorine. For example, the end point of the etching is controlled by the etching time.

When the first semiconductor layer 20 is a GaN layer, for example, the etching of the semiconductor substrate 10 is stopped at the timing at which gallium is detected by the endpoint detector of the dry etching (see FIG. 5A). Subsequently, the etching gas is switched, and etching of the first semiconductor layer 20 is started. Continuing, the etching is stopped at the timing at which the etching time of the first semiconductor layer 20 reaches a prescribed time.

Continuing, the connection conductor 80 is formed inside the via hole VH; and the metal layer 70 is formed on the back surface of the semiconductor substrate 10 (see FIG. 3C).

Figure 6A:
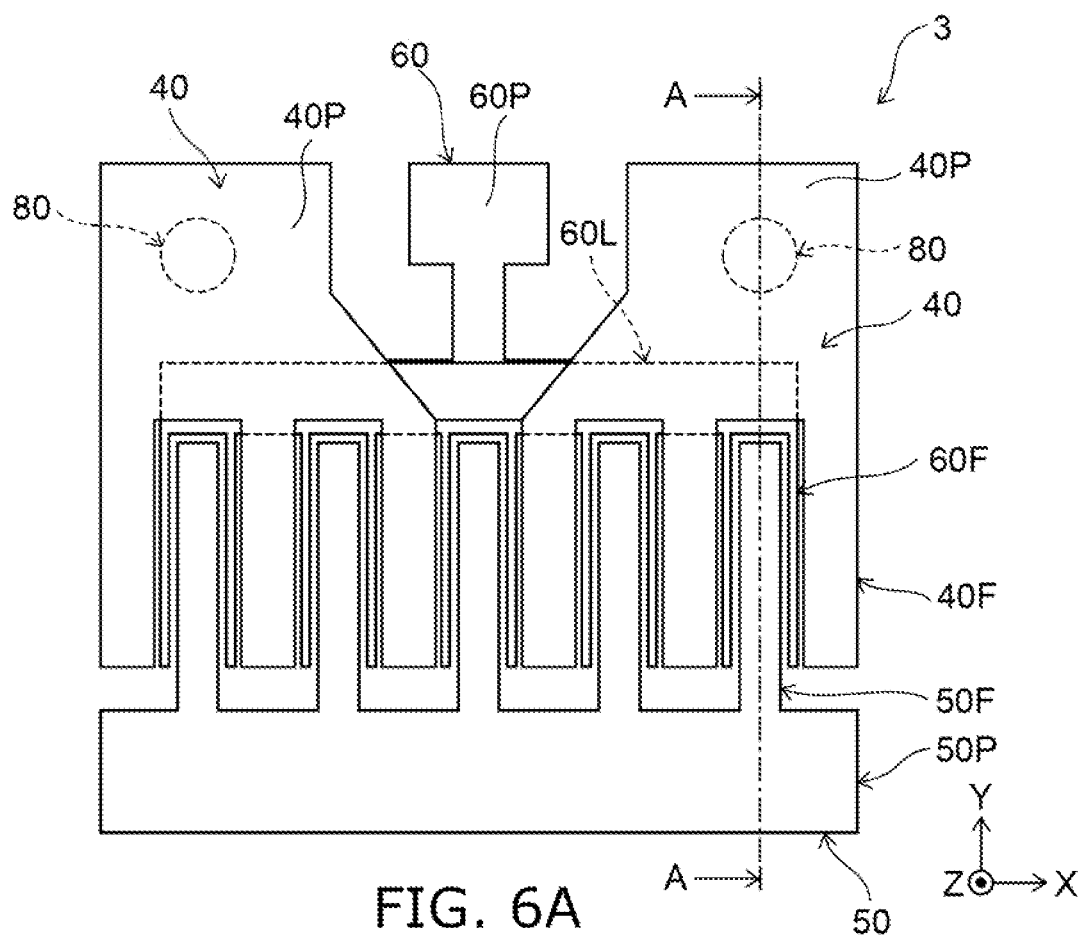
FIG. 6 are schematic views showing a semiconductor device according to another modification of the embodiment.
Figure 6B:
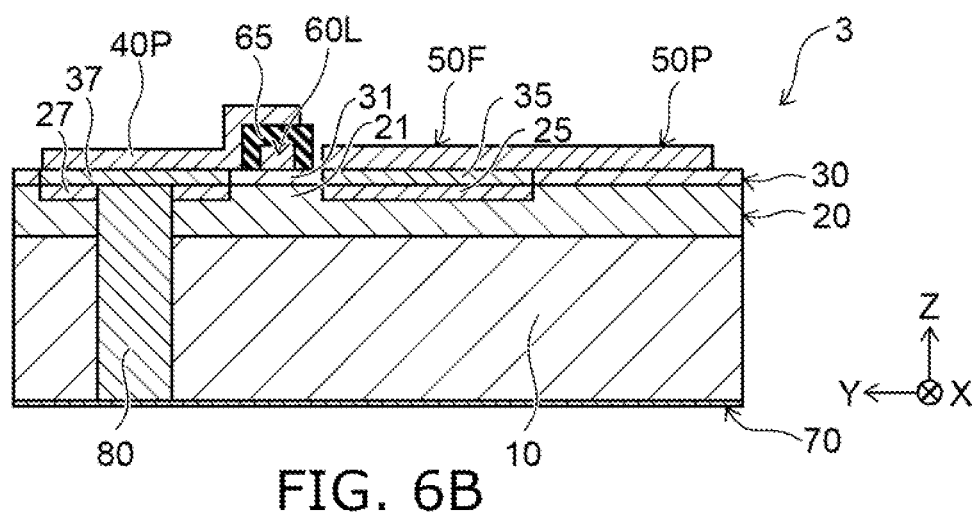

FIGS. 6A and 6B are schematic views showing a semiconductor device 3 according to another modification of the embodiment. FIG. 6A is a schematic plan view illustrating the upper surface of the semiconductor device 3. FIG. 6B is a schematic cross-sectional view along line A-A shown in FIG. 6A.

As shown in FIG. 6A, the first electrode 40 includes multiple finger parts 40F and a bonding pad part 40P. For example, the multiple finger parts 40F are provided to extend in the Y-direction and to be linked to the bonding pad part 40P.

The second electrode 50 includes multiple finger parts 50F and a bonding pad part 50P. For example, the multiple finger parts 50F extend in the Y-direction from the bonding pad part 50P. The multiple finger parts 50F are provided to be linked to the bonding pad part 50P.

For example, the finger part 40F of the first electrode 40 and the finger part 50F of the second electrode 50 are alternately arranged in the X-direction. The finger part 40F is provided on the second region 33 of the second semiconductor layer 30; and the finger part 50F is provided on the third region 35 of the second semiconductor layer 30 (see FIG. 1).

The third electrode 60 includes multiple finger parts 60F, a wiring part 60L, and a bonding pad part 60P. Each finger part 60F extends in the Y-direction between the finger part 40F of the first electrode 40 and the finger part 50F of the second electrode 50. The finger part 60F is provided on the first region 31 of the second semiconductor layer 30 (see FIG. 1). The wiring part 60L extends in the X-direction; and the finger part 60F is linked to the wiring part 60L. The wiring part 60L is linked to the bonding pad part 60P.

As shown in FIG. 6B, the first semiconductor layer 20 further includes a fourth region 27; and the second semiconductor layer 30 further includes a fourth region 37. The fourth region 27 of the first semiconductor layer 20 and the fourth region 37 of the second semiconductor layer 30 are provided between the semiconductor substrate 10 and the bonding pad part 40P of the first electrode 40. The first semiconductor layer 20 includes a portion positioned between the semiconductor substrate 10 and the fourth region 27.

The fourth region 27 of the first semiconductor layer 20 includes a first-conductivity-type impurity with a higher concentration than the first-conductivity-type impurity of the first region 21. Also, the fourth region 37 of the second semiconductor layer 30 includes a first-conductivity-type impurity with a higher concentration than the first-conductivity-type impurity of the first region 31.

The connection conductor 80 extends inside the semiconductor substrate 10 and the first semiconductor layer 20 and is electrically connected to the fourth region 27 of the first semiconductor layer 20 and the fourth region 37 of the second semiconductor layer 30. The fourth region 37 of the second semiconductor layer 30 is positioned between the connection conductor 80 and the bonding pad part 40P of the first electrode 40. The connection conductor 80 is electrically connected to the bonding pad part 40P of the first electrode 40 via the fourth region 37.

The first region 21 of the first semiconductor layer 20 also is provided between the third region 25 and the fourth region 27. Also, the first region 31 of the second semiconductor layer 30 is provided between the third region 35 and the fourth region 37.

The wiring part 60L of the third electrode 60 is provided on the first region 31 of the second semiconductor layer 30. For example, at turn-off of the semiconductor device 3, the wiring part 60L depletes the first region 21 of the first semiconductor layer 20 between the third region 25 and the fourth region 27 and the first region 31 of the second semiconductor layer 30 between the third region 35 and the fourth region 37. Leakage current between the bonding pad part 40P of the first electrode 40 and the finger part 50F of the second electrode can be blocked thereby.

The wiring part 60L of the third electrode 60 is electrically insulated from the bonding pad part 40P of the first electrode 40 by an insulating film 65. The insulating film 65 is provided between the bonding pad part 40P of the first electrode 40 and the wiring part 60L of the third electrode 60 and covers the wiring part 60L. The insulating film 65 is, for example, a silicon oxide film.

Although the third region 25 of the first semiconductor layer 20 and the third region 35 of the second semiconductor layer 30 are not provided under the bonding pad part 50P of the second electrode 50 in the example shown in FIG. 6B, the third region 25 and the third region 35 may be provided under the bonding pad part 50P.

Figure 7:
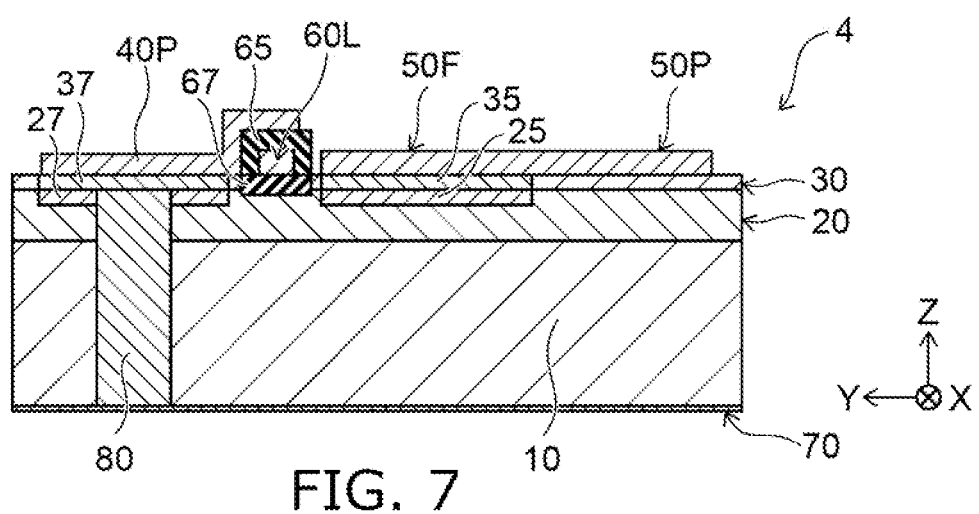
FIG. 7 is a schematic cross-sectional view showing a semiconductor device according to yet another modification of the embodiment.

FIG. 7 is a schematic view showing a semiconductor device 4 according to another modification of the embodiment. FIG. 7 illustrates a cross section corresponding to FIG. 6B of the semiconductor device 4.

In the semiconductor device 4 as shown in FIG. 7, an insulating film 67 is provided between the third region 25 and the fourth region 27 of the first semiconductor layer 20 and between the third region 35 and the fourth region 37 of the second semiconductor layer 30. The insulating film 67 blocks a leakage current between the bonding pad part 40P of the first electrode 40 and the finger part 50F of the second electrode.

For example, the insulating film 67 is provided inside a trench formed in the first region 21 between the third region 25 and the fourth region 27 of the first semiconductor layer 20 and in the first region 31 between the third region 35 and the fourth region 37 of the second semiconductor layer 30.

The insulating film 67 is, for example, a silicon oxide film. The wiring part 60L of the third electrode 60 is provided on the insulating film 67.

Figure 8A:
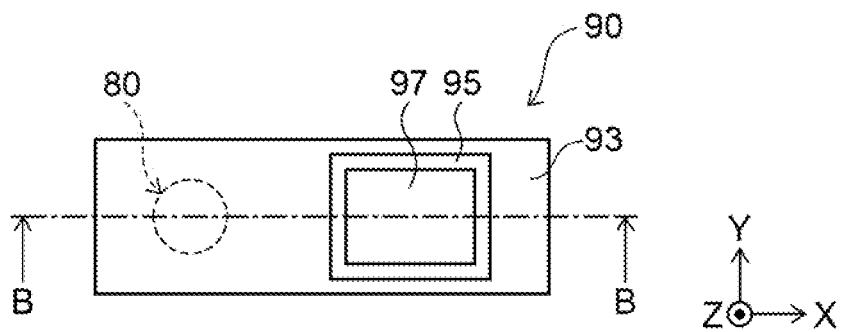
FIG. 8 are schematic views showing another semiconductor device according to the embodiment.
Figure 8B:
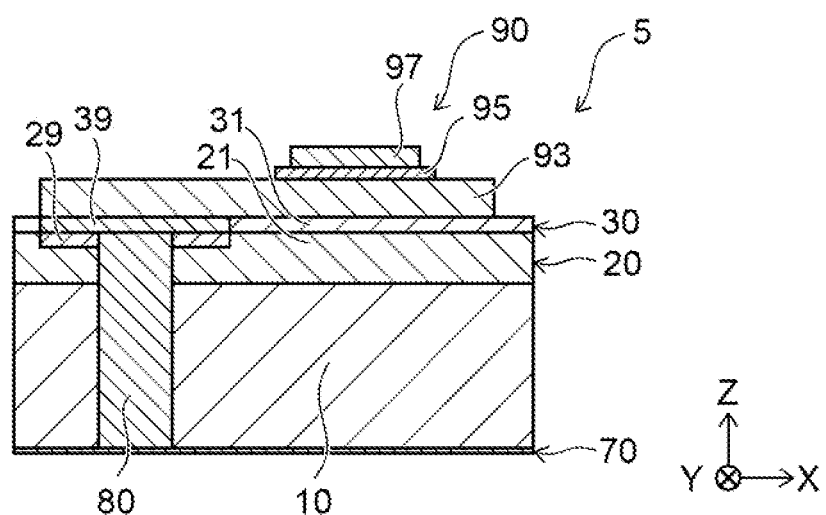

FIGS. 8A and 8B are schematic views showing another semiconductor device 5 according to the embodiment. FIG. 8A is a plan view showing a capacitor 90. FIG. 8B is a schematic cross-sectional view showing the semiconductor device 5 that includes the capacitor 90 on the second semiconductor layer 30.

As shown in FIG. 8A, the capacitor 90 includes a first metal electrode 93, a dielectric film 95, and a second metal electrode 97. For example, the first metal electrode 93, the dielectric film 95, and the second metal electrode 97 are stacked in the Z-direction; and the dielectric film 95 is provided between the first metal electrode 93 and the second metal electrode 97. The first metal electrode 93 and the second metal electrode 97 include, for example, gold and chrome. The dielectric film 95 includes, for example, a high dielectric constant material such as aluminum oxide, hafnium oxide, etc.

As shown in FIG. 8B, the capacitor 90 is provided on the second semiconductor layer 30. For example, the first metal electrode 93 of the capacitor 90 contacts the second semiconductor layer 30. Also, the capacitor 90 is included with the semiconductor device 1 shown in FIG. 1 in, for example, a MMIC (Monolithic Microwave Integrated Circuit).

In the example, the first semiconductor layer 20 further includes a fifth region 29. The fifth region 29 is provided between the semiconductor substrate 10 and the first metal electrode 93. The first semiconductor layer 20 includes a portion positioned between the semiconductor substrate 10 and the fifth region 29. The fifth region 29 includes a first-conductivity-type impurity with a higher concentration than the first-conductivity-type impurity of the first region 21.

The second semiconductor layer 30 further includes a fifth region 39. The fifth region 39 is provided between the first metal electrode 93 and the fifth region 29 of the first semiconductor layer 20. The fifth region 39 includes a first-conductivity-type impurity with a higher concentration than the first-conductivity-type impurity of the first region 31.

The semiconductor device 5 further includes another connection conductor 80. The connection conductor 80 is provided to extend inside the semiconductor substrate 10 and the first semiconductor layer 20 and to contact the fifth region 29 of the first semiconductor layer 20 or the fifth region 29 and the fifth region 39 of the second semiconductor layer 30. The connection conductor 80 is electrically connected to the first metal electrode 93 via the fifth region 29 of the first semiconductor layer 20 and the fifth region 39 of the second semiconductor layer 30. Also, the fifth region 39 of the second semiconductor layer 30 is positioned between the connection conductor 80 and the first metal electrode 93.

In the semiconductor device 5, the first metal electrode 93 is electrically connected to the metal layer 70 on the back surface of the semiconductor substrate 10 via at least the connection conductor 80 and the fifth region 39 of the second semiconductor layer 30.

While certain embodiments of the inventions have been described, these embodiments have been presented by way of example only, and are not intended to limit the scope of the inventions. These novel embodiments may be embodied in a variety of other forms; and various omissions, substitutions, and changes may be made without departing from the spirit of the inventions. Such embodiments and their modifications are within the scope and spirit of the inventions, and are within the scope of the inventions described in the claims and their equivalents.

The invention claimed is:

1. A semiconductor device, comprising:
a semiconductor substrate;
a first semiconductor layer provided on the semiconductor substrate;
a second semiconductor layer provided on the first semiconductor layer;
a first electrode provided on the second semiconductor layer;
a second electrode provided to be arranged with the first electrode along a front surface of the second semiconductor layer;
a third electrode provided between the first electrode and the second electrode on the second semiconductor layer;
a metal layer provided on a back surface of the semiconductor substrate at a side opposite to the first semiconductor layer; and
a conductor extending inside the semiconductor substrate, the conductor electrically connecting the first electrode and the metal layer via the second semiconductor layer, the second semiconductor layer including
a first region including a first-conductivity-type impurity, and
a second region including a first-conductivity-type impurity with a higher concentration than the first-conductivity-type impurity of the first region,
the second region of the second semiconductor layer being provided between the conductor and the first electrode.

2. The semiconductor device according to claim 1, wherein
the first semiconductor layer includes:
a first region including a first-conductivity-type impurity; and
a second region including a first-conductivity-type impurity with a higher concentration than the first-conductivity-type impurity of the first region, and
the second region of the second semiconductor layer is provided between the first electrode and the second region of the first semiconductor layer.

3. The semiconductor device according to claim 2, wherein
the conductor contacts the second region of the second semiconductor layer.

4. The semiconductor device according to claim 2, wherein
the conductor contacts the second region of the first semiconductor layer.

5. The semiconductor device according to claim 2, wherein
the second region of the first semiconductor layer contacts the second region of the second semiconductor layer.

6. The semiconductor device according to claim 2, wherein
the second semiconductor layer further includes a third region provided between the second electrode and the first semiconductor layer, and
the third region includes a first-conductivity-type impurity with a higher concentration than the first-conductivity-type impurity of the first region of the second semiconductor layer.

7. The semiconductor device according to claim 6, wherein
the first semiconductor layer further includes a third region,
the third region includes a first-conductivity-type impurity,
the third region of the second semiconductor layer is provided between the second electrode and the third region of the first semiconductor layer, and
the third region of the first semiconductor layer includes the first-conductivity-type impurity with a higher concentration than the first-conductivity-type impurity of the first region of the first semiconductor layer.

8. The semiconductor device according to claim 1, wherein
a bandgap of the second semiconductor layer is wider than a bandgap of the first semiconductor layer.

9. The semiconductor device according to claim 1, wherein
the first semiconductor layer has a higher resistance than the second semiconductor layer.

* * * * *